US005430613A

United States Patent [19]

Hastings et al.

[11] Patent Number: 5,430,613

[45] Date of Patent: Jul. 4, 1995

[54] CURRENT TRANSFORMER USING A LAMINATED TOROIDAL CORE STRUCTURE AND A LEAD FRAME

[75] Inventors: Jerome K. Hastings, Sussex; Bruce C. Beihoff, Wauwatosa; James E. Hansen, Oak Creek; Mark A. Juds, New Berlin; Steven C. Kaishian, Wauwatosa; Charles J. Tennies, Waukeska, all of Wis.

[73] Assignee: Eaton Corporation, Cleveland, Ohio

[21] Appl. No.: 69,338

[22] Filed: Jun. 1, 1993

[51] Int. Cl.[6] ........................ H05K 7/06; H01F 27/30; H01F 40/06

[52] U.S. Cl. ........................ 361/760; 29/606; 324/127; 336/174; 336/200; 336/229

[58] Field of Search ............... 336/174, 175, 200, 233, 336/234, 212, 229; 361/760, 767, 774, 777; 324/127; 29/602.1, 606

[56] References Cited

U.S. PATENT DOCUMENTS

| | | | |
|---|---|---|---|
| 3,289,279 | 12/1966 | Camp | 29/155.57 |
| 3,305,814 | 2/1967 | Moyer | 336/200 |
| 3,323,091 | 5/1967 | Hibbits | 336/175 |
| 3,659,240 | 4/1972 | Learned et al. | 336/200 |
| 4,103,267 | 7/1978 | Olschewski | 336/65 |
| 4,217,168 | 8/1980 | Ridgway et al. | 430/320 |
| 4,297,647 | 10/1981 | Akiyama et al. | 330/307 |
| 4,522,671 | 6/1985 | Grunwald et al. | 156/235 |
| 4,649,639 | 3/1987 | Mas | 336/229 |
| 4,777,465 | 10/1988 | Meinel | 336/200 |
| 4,823,075 | 4/1989 | Alley | 324/117 |
| 4,918,417 | 4/1990 | Sakamoto | 336/200 |
| 4,959,631 | 9/1990 | Hasegawa et al. | 336/200 |
| 4,975,671 | 12/1990 | Dirks | 336/65 |
| 5,015,945 | 5/1991 | Radun | 324/127 |

FOREIGN PATENT DOCUMENTS

| | | | |
|---|---|---|---|
| 0512718 | 11/1992 | European Pat. Off. | 41/02 |
| 3046944 | 12/1980 | Germany | 21/12 |
| 3016067 | 10/1981 | Germany | H05K 3/30 |
| 2-54505 | 2/1990 | Japan | 336/200 |
| 3-263805 | 11/1991 | Japan | 336/200 |
| 5-190364 | 7/1993 | Japan | 336/200 |

OTHER PUBLICATIONS

W. Wiechec, "New Techniques For Production of Ferrite Cores", Electronics May 13, 1968, pp. 180–182.

*Primary Examiner*—Thomas J. Kozma
*Attorney, Agent, or Firm*—Loren H. Uthoff, Jr.

[57] ABSTRACT

A current transformer device is formed on a ceramic substrate which is provided with a plurality of planar conductive tracks formed on a surface of the substrate where the conductive tracks extend substantially radially from an imaginary point on the surface of the substrate. A structure of permeable material layers is then tape cast or epitaxially formed by vapor deposition of a thick film of magnetic ceramic over the major portion of each of the conductive tracks to form a permeable toroidal core. A lead frame is then placed over the core and a plurality of metal conductors are soldered to each of the respective exposed ends of the metal conductive tracks on the substrate to form a toroidal coil surrounding the toroidal core. The required electrical elements to complete the current transformer device are mounted to a second side of the ceramic substrate and electrically connected to the toroidal coil for powering and/or receiving signals therefrom.

19 Claims, 4 Drawing Sheets

FIG 1
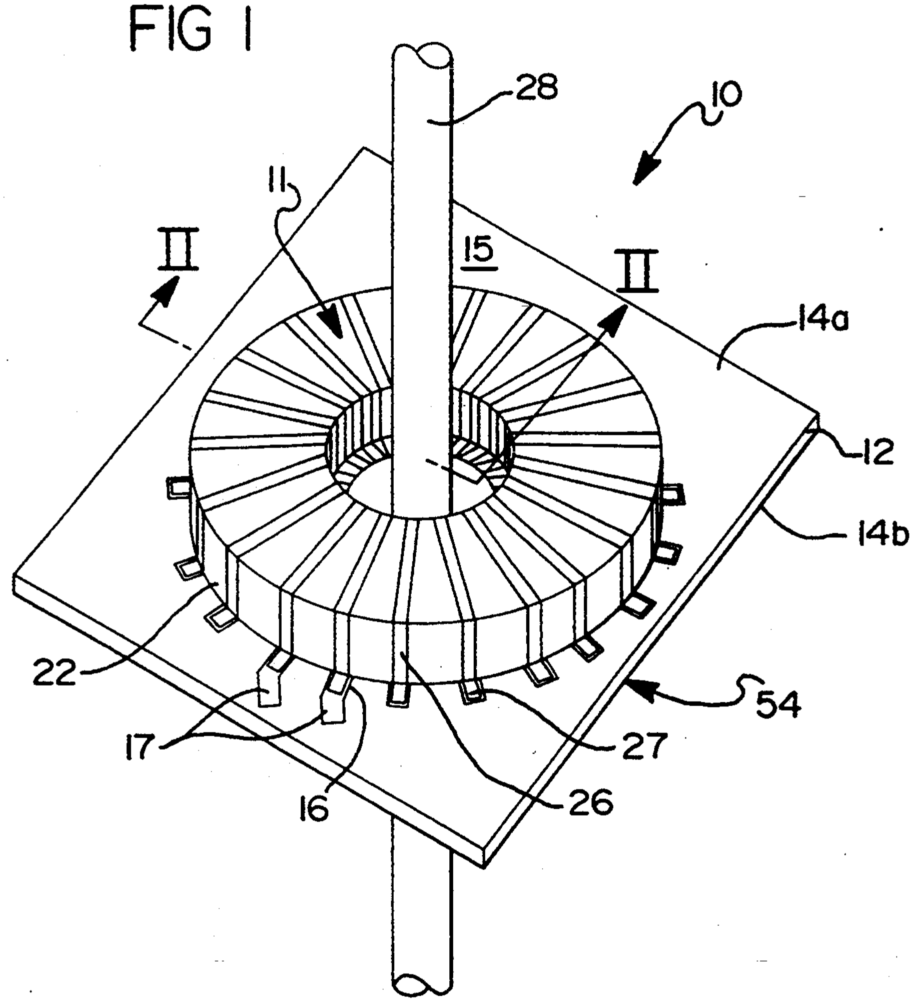
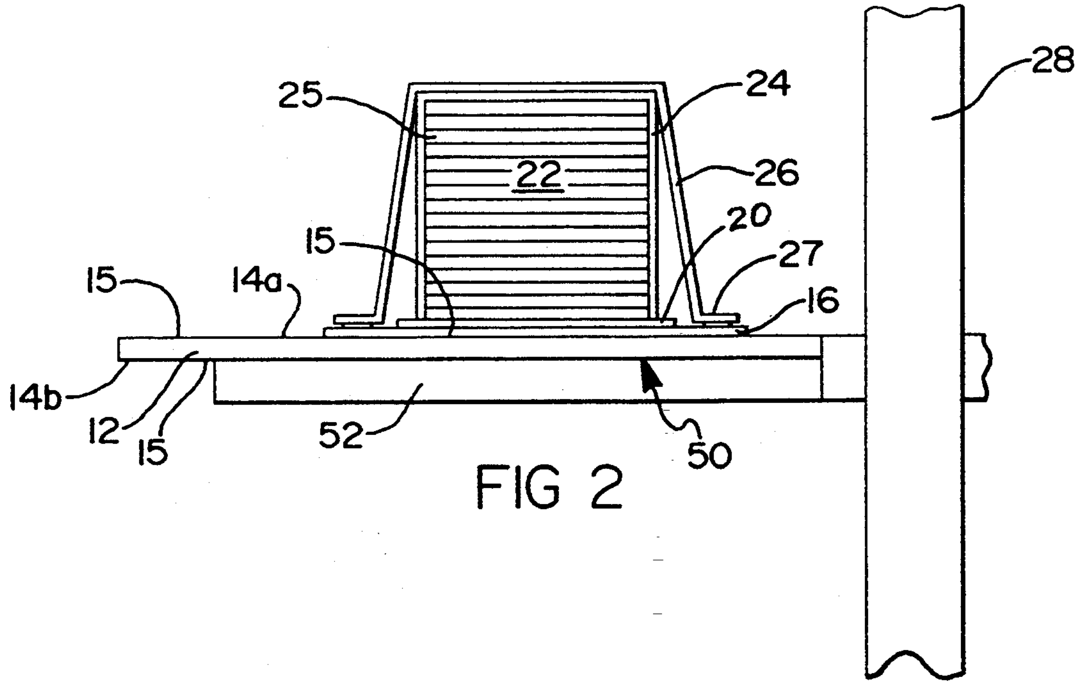
FIG 2

FIG 3
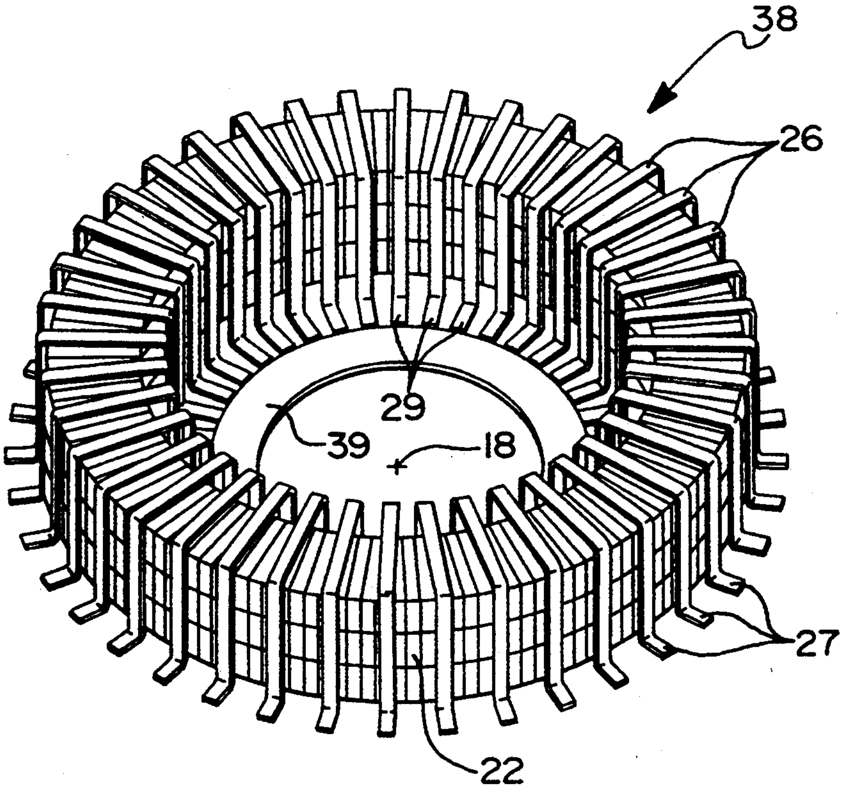
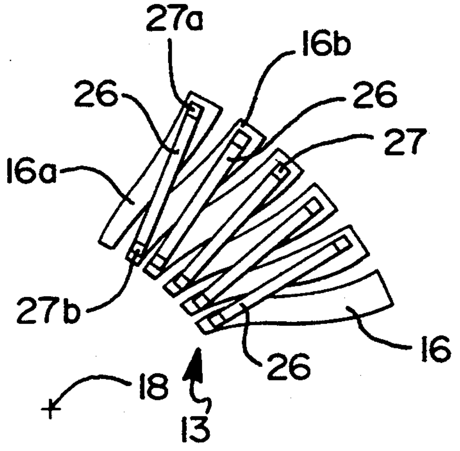
FIG 4

FIG 5
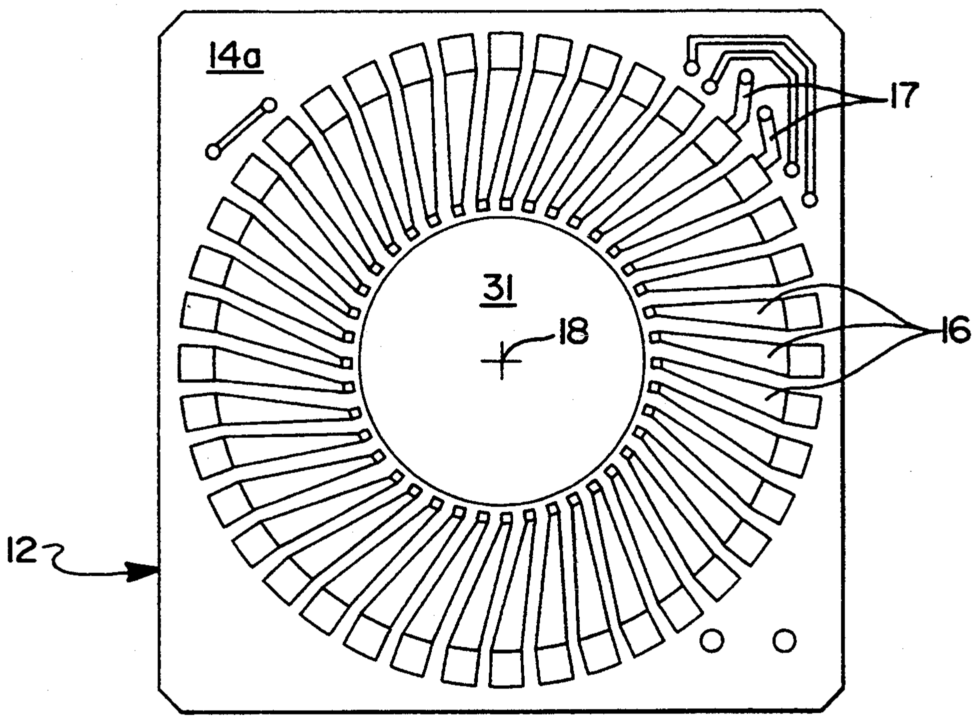
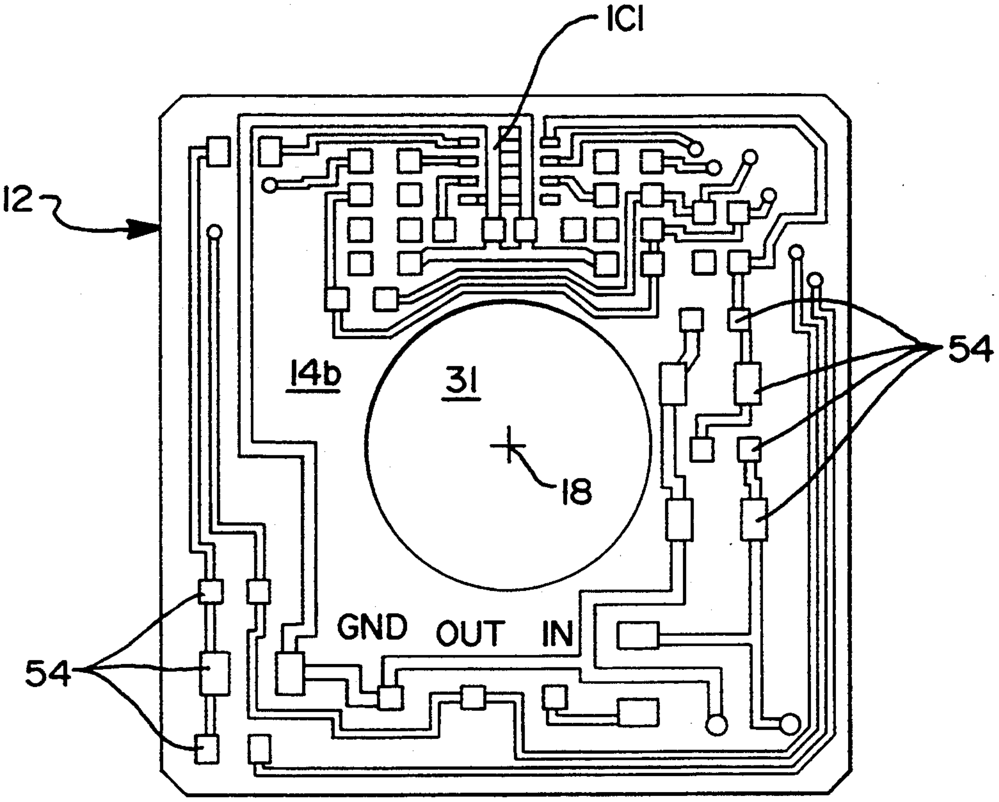
FIG 6

CURRENT TRANSFORMER USING A LAMINATED TOROIDAL CORE STRUCTURE AND A LEAD FRAME

FIELD OF THE INVENTION

The present invention relates to inductors, and more specifically, to current transformers of the toroidal type suitable for utilization in hybrid integrated circuit environments.

DESCRIPTION OF THE PRIOR ART

Traditionally, a ferrite or laminated or tape wound steel core is hand wound with a length of electrically conductive wire to provide an electrical inductor. The inductors can then be mounted to a support structure such as a printed circuit board or a ceramic substrate using a boarding resin or the coil leads, which can also consist of coil taps, can be soldered to the support structure which then provide support to the inductor.

It has been found to be quite difficult to use inductors fabricated using this method in hybrid integrated circuit assemblies. The bulk inherent in such inductors created by the wire, the large wire lead location tolerances required, and the difficulty in connecting the wire leads to the circuit board result in high manufacturing cost and an unsatisfactory integrated circuit package.

The prior art has suggested many technologies for overcoming the difficulties encountered when inductances are to be incorporated in solid state circuit devices. For example, U.S. Pat. No. 3,305,814 granted to Moyer; U.S. Pat. No. 3,659,240 granted to Learned; and U.S. Pat. No. 3,858,138 granted to Gittleman et al, the disclosures of which are hereby expressly incorporated by reference, each disclose the use of deposition techniques to derive appropriate inductances using multiple layers of magnetic material. Using these prior art deposition techniques, the power handling capability is quite limited and will not provide the necessary inductance or power handling capabilities required for many integrated circuit applications.

The prior art also discloses various methods of forming the wire looping over the permeable core to form a toroidal or non-toroidal inductor structure. U.S. Pat. No. 4,103,267 entitled "Hybrid Transformer Device", the disclosure of which is hereby incorporated by reference, describes a ceramic substrate having a plurality of planar conductors which are formed of metallized strips on ceramic substrate. A dielectric glass material is formed over the conductors leaving only the exposed ends of the conductors available for connection to an electric circuit such as a wire looping a ferrite core. A sintered one piece ferrite toroidal core is precoated with insulating material and is adhesively secured to the dielectric layer. A plurality of wire conductors are wire bonded at one end to an exposed end of the metallized conductors on the surface of the substrate. The wire conductor is then looped over the toroid and secured at the opposite end of the wire conductor to the exposed end of an adjacent metallized conductor to form a loop of a transformer winding using a wire bonding technique.

One problem with the toroidal hybrid integrated circuit of the '267 patent is the low current carrying capability of the winding formed by the wire bonding process. Small gage wires wire bonded to a substrate do not have sufficient current carrying capability to supply power to other on-board electronics. Another problem is in the manufacturing of the coil using the wire bonding process itself which requires substantial time and precision to properly form the wire bond with the conductive tracks.

U.S. Pat. No. 4,522,671 granted to Grunwald et al discloses a method of joining conductive tracks formed on a substrate carrier using paste strips to form interconnected windings over a toroidal core. U.S. Pat. No. 4,777,465 discloses a method of forming a high number of windings on a ferrite core by shaping the core into a square and using wire bonding to join conductors which pass over the core to metal conductors formed in a ceramic substrate. Wire bonding is an efficient method of attaching small diameter conductors to a substrate or other connector pad but the process is not conducive for connection of larger conductors capable of carrying higher levels of electric current and having a decreased value of resistance to minimize losses. Both U.S. Pat. No. 4,526,671 and U.S. Pat. No. 4,777,465 are hereby incorporated by reference herein.

There is a continuing need for an improved transformer of the general type used in measuring electrical current in a conductor where the characteristics of the permeable core can be tailored with the use of selected materials and/or gaps in the material thereby altering the saturation characteristics. In order to improve the saturation characteristics of the ferrite core, it is necessary to provide one or more gaps in the core to prevent saturation which would limit the useful range of a current transformer device. There is also a need for a low cost, high volume manufacturing method to produce a current transformer device with high current carrying capability.

SUMMARY OF THE INVENTION

Accordingly, the present invention discloses a method of forming an inductor specifically, a toroidal current transformer, on a ceramic substrate by depositing a plurality of stacked thick film layers of permeable material over a plurality of conductive tracks formed on the substrate. The conductive tracks are then electrically connected using a plurality of connection wires held in a lead frame to form a toroidal coil encircling the permeable core. Connection taps at various points along the winding can be made to select various inductance values. In the alternative, a permeable inductive core can be fabricated by "tape casting" where a ferrite powder is mixed with appropriate organic materials to yield a flexible tape which is cut into thin rings which are laid down one on top of the other on the ceramic substrate, then heat laminated, and then fired to form the toroidal core structure.

By using standard thick film techniques such as printing or tape casting to form a permeable toroidal core on the substrate, high production volumes of a compact hybrid inductor device can be formed at low cost with high precision. The thick film deposition processes also allow for the custom blending that determines the metallurgy of the layers that make up the permeable core so as to effectuate the desired inductive characteristics including magnetic gaps formed in the core to improve its saturation characteristics.

The method of forming an inductive element on a ceramic substrate of the present invention using a lead frame to form a surrounding coil has the advantage that a toroidal coil device can be readily formed with a substantial decrease in manufacturing time and complexity while forming an inductance device that is compact in size with substantial current carrying capability.

In place of a plurality of connecting wires wire bonded to the conductive tracks, a wire lead frame is used where a plurality of metal conductor strips are held together in position by a connector section where the metal conductors placed over the core previously printed with solder paste and then reflow soldered to the conductive tracks. The lead frame connector section is then cut away to separate the individual metal conductors for proper electrical function.

Active and passive electrical components can be formed and mounted on the reverse side of the ceramic substrate to provide the necessary circuit to complete such functions as electrical current measurement. The large diameter conductor carrying an electrical current to be measured is passed through the center of the toroidal current transformer formed on the substrate and forms a single turn primary winding. The output of the toroidal coil secondary is connected to the components on the second side of the substrate where an output signal indicative of the current level is generated. To increase the apparent level of sensed current, the conductor can be interweaved with the secondary around the core to form a multi-turn primary coil.

A provision of the present invention is to form a layered structure of permeable material on a ceramic substrate over a plurality of conductive tracks.

Another provision of the present invention is to form a layered inductive element on a ceramic substrate using a lead frame having a plurality of metal conductors to electrically connect a plurality of conductive tracks partially lying under the permeable structure.

Another provision of the present invention is to alter the metallurgy of different layers the permeable material to achieve a desired inductive characteristic where the material is deposited on a ceramic substrate using traditional thick film techniques.

Another provision of the present invention is to provide an inductor having a low resistance, high current carrying capability relative to its overall size by soldering a wire frame conductive structure over a permeable layered core structure.

Another provision of the present invention is to provide a compact, efficient device to measure the current passing through an electrical conductor by passing the electrical conductor through a toroidal core formed using the teaching of the present invention.

Another provision of the present invention is to form an inductive structure on one side of a ceramic substrate using deposition of a plurality of layers of a permeable material and provide other electrical components mounted on a second side of the ceramic substrate that are used to electronically process the signals generated by the inductor.

Another provision of the present invention is to tape cast a plurality of annular layers of a thick film magnetic paste which is then heat laminated and fired to form an inductive core on a ceramic substrate.

Still another provision of the present invention is to provide a low cost, compact, efficient AC current sensor which provides isolation of the conductor from the sensing electronics.

An inductance element formed on a nonconductive substrate having a toroidal permeable core formed of a thick film permeable paste material which is deposited in a plurality of layers over a plurality of metallized conductive tracks on the substrate carrier, a plurality of metal conductors connected in a lead frame are then soldered to the conductive tracks to form a toroidal coil which encircles the toroidal permeable core. An aperture is formed in the center of the substrate at the center of the toroidal coil where the output of the coil is connected to an electronics package mounted to the opposite side of the substrate for measuring the current flow in a conductor passing through the aperture.

BRIEF DESCRIPTION OF THE DRAWINGS

FIG. 1 is a perspective view of the inductive device of the present invention mounted on a substrate;

FIG. 2 is a cross-sectional view of the inductive device of the present invention with conductive tracks and metal conductors to form a coil;

FIG. 3 is a perspective view of the toroidal permeable core structure of the present invention;

FIG. 4 is an elevational view of the ceramic substrate having conductive tracks;

FIG. 5 is a perspective view of the lead frame of the present invention prior installation;

FIG. 6 is an elevational view of the second side of the ceramic substrate of the present invention showing the electronic components formed on the substrate.

DETAILED DESCRIPTION OF THE PREFERRED EMBODIMENTS

Figure 7:
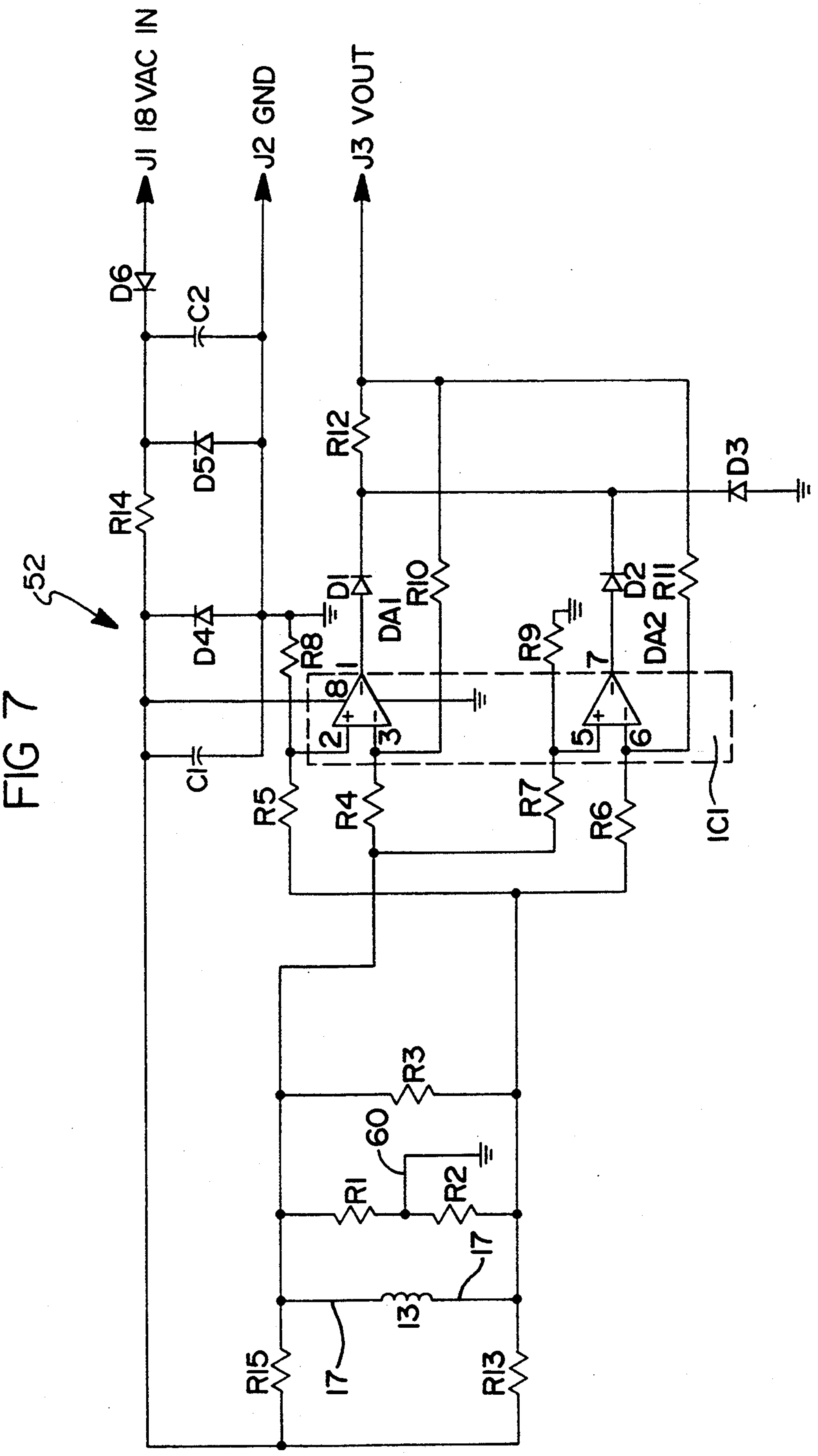
FIG. 7 is a schematic diagram of the electronics package for generating a desired output signal from the current transformer of the present invention.

Referring now to the drawings, a hybrid inductor device constructed in accordance with the teachings of the present invention will be described in terms of a typical ferrite toroid. Specifically, a ferrite toroid that is used as a current transformer to measure the electrical current in a conductor which passes through the center of the toroidal coil of the present invention. A substrate that in most integrated circuit applications will be formed of a ceramic material, includes a first planar surface which forms the basis for receiving a plurality of metal conductors and a second planar surface that forms the basis for receiving a plurality of electrical discrete components.

FIG. 1 shows a perspective view of the current transformer assembly 10 of the present invention comprised of the current transformer 11 mounted to a substrate 15 with an electrical current carrying conductor 28 disposed through the center thereof. Basically, the current transformer device 10 of the present invention includes a ceramic substrate 12, a common example being ceramic alumina, carrying a plurality of conductive tracks 16. The conductive tracks 16 are formed through the utilization of conventional metallization techniques commonly used in hybrid circuit manufacturing processes. The metal conductive tracks 16 may be formed, for example, with a screen printing paste that is fire-formed to provide a metallized layer in the desired shape and design. Metallization may be formed utilizing a screen printing paste manufactured and sold by EMCA known by their designation as 212B. The resulting metal conductive tracks 16 are of gold base. Gold or other precious metal conductors have generally been utilized in integrated circuit environments requiring attachment to wire conductors in view of the bonding techniques generally available; however, the conductive tracks 16 may be formed of nonprecious metals if other connection techniques are used besides the typical soldering or wire bonding process.

It may be noted that the conductive tracks 16 each have a predetermined length and extend generally radially from an imaginary point 18 (shown in FIG. 5) on the surface of the substrate 12. The radial configuration of the conductive tracks 16 is dictated by the shape of the transformer toroidal core 22 as will be described more fully hereinafter. A layer 15 of dielectric material is formed over the conductive tracks 16 and covers the major portion of each of the conductive tracks 16; that is, the dielectric layer 15 will leave the inner and outer ends of the conductive tracks 16 exposed while providing an electric insulating layer for a "washer" shaped area covering the intermediate lengths of each of the conductive tracks 16. The dielectric layer 15 may be formed of a typical dielectric layer utilized for passivation in integrated circuit technology. For example, the layer 15 can conveniently be formed using a thick film glass paste readily available from DuPont and designated as their glass paste no. 9841. This latter paste provides the added advantage of a high dielectric strength which may be desirable in some applications of the present apparatus.

A toroidal core 22 is formed by deposition of a plurality of stacked annular layers 25 of magnetic material such as a metal ceramic or ferrite powder which has been mixed to form a thick film paste. The toroidal core 22 is then fired using traditional thick film techniques. As an alternative method, the ferrite powder can be formulated in the form required for a "tape casting" process well known in the art. Thin annular slices are then layered one on top the other to form a toroidal core 22 structure which is then heat laminated and fired. In either case, the metallurgy of each individual annular layer 25 can be varied to yield the desired magnetic characteristics. Magnetic gaps can be built into the toroidal core 22 using annular layers 24 with different thick film paste mixes.

Disposed over the outside of the toroidal core 22 is a plurality of metal conductors 26 which are initially carried as one structure in the form of a lead frame 38. The ends of each of the metal conductors 26 are soldered using traditional techniques such as wave soldering, to the conductive tracks 16 such that adjacent conductive tracks 16 are electrically connected to form a toroidal coil 13 which surrounds the permeable toroidal core 22 to form a current transformer 11. An electrical conductor 28 which carries a current whose amplitude is to be measured passes through the center of the toroidal core 22. The output of the toroidal coil 13 is connected by way of output coil tracks 17 to a multiplicity of electrical elements 54 which are mounted on the opposite side of the substrate 12 as the core 22 and operate to electronically transform the output of the toroidal coil 13 into a signal that represents the level of current flowing in the conductor 28. The schematic and operation of the electronics package 52 is described in detail with reference to FIG. 7.

Now referring to FIG. 2, a sectional view of FIG. 1 of the current transformer device 10 of the present invention is shown. A ceramic substrate 12 is provided with a plurality of conductive tracks 16 formed on the first planar surface 14*a* of the ceramic substrate 12 where the conductive tracks 16 extend substantially radially from an imaginary point 18 on the first planar surface 14*a* of the ceramic substrate 12. A dielectric layer 20 is formed over the major portion of each of the conductive tracks 16 to form a dielectric layer 20 in the shape of a ring upon which a toroidal core 22 is formed of a permeable material such as a metal ceramic or ferrite powder mix or other type of magnetic paste by sequentially layering such material using traditional hybrid circuit thick film deposition techniques. The assembly is then fired and sintered to set the characteristics of the components on the ceramic substrate 12. The toroidal core 22 is then coated with an insulating material 24. A plurality of metal conductors 26 which are held in a lead frame 38 are then placed over the toroidal core 22 and each end of the metal conductor 26 is soldered to each respective end of the conductive tracks 16 thereby forming a toroidal coil 13 around the toroidal core 22 forming the current transformer 11.

In accordance with preferred embodiment, a ceramic substrate 12 is provided with a plurality of conductive tracks 16 which are formed of metallized strips on the ceramic substrate 12. A dielectric glass material forms a dielectric layer 15 over the conductive tracks 16 leaving only the exposed ends of the conductive tracks available for connection to an electric circuit. As seen on the cross-section view of FIG. 2, the toroidal core 22 is made up of a plurality of layers of a magnetic ceramic thick film paste or a plurality of tape cast layers with proper magnetic characteristics which are then fired at a high temperature or heat laminated to form the final characteristics and structure of the toroidal core 22. The toroidal core 22 is then coated with an insulating material 24. Also shown is the dielectric layer 20 which covers all but the ends of the conductive tracks 16. A lead frame 38 is used to hold a plurality of metal conductors 26 together in one structure which is placed over the toroidal core 22. The ends of the metal conductors 26 are then soldered to the ends of the conductive track 16. The lead frame structure then severed by removing the center section of the lead frame which severs the connection between the metal conductors 26.

A dielectric layer 15 also coats both the first planar surface 14*a* of the ceramic substrate 12 and the second planar surface 14*b* of the ceramic substrate 12. An electronics package 52 is mounted to the second planar surface 14*b* and is electrically connected to the electrical coil at the output coil tracks 17 formed by the metal conductors 26 and the conductive tracks 16 and functions to electrically amplify and condition the signal generated by the current flowing in the conductor 28 which causes electrical changes in the output of the toroidal coil 13. That signal is then electrically conditioned for output to a readout device (not shown) or additional electronic circuitry reflecting the level of the electrical current carried in the conductor 28. A typical electronic circuit is shown in FIG. 7 and will be discussed in detail in a subsequent section of this disclosure.

FIG. 3 is a perspective view of the wire lead frame 38 covering the toroidal core 22 just prior to the soldering operation where the conductive tracks 16 and the ceramic substrate 12 are not shown. The metal conductors 26 are joined together in the center by a connector section 39 which is subsequently removed after the soldering operation thereby separating each of the metal conductors 26 one from the other. The use of a lead frame 38 consisting of a plurality of metal conductors 26 attached to a connector section 39 provides an efficient method of forming a toroidal coil 13 when used in conjunction with conductive tracks 16 provides a very efficient method of forming a toroidal coil 13 around the toroidal core 22 thereby providing the basic inductor section of the current transformer of the present invention 10.

FIG. 4 is an elevational view of the metal conductors 26 joined to the conductive tracks 16 around the imaginary point 18. The metal conductors 26 are positioned and connected to the conductive tracks 16 such that the electrical effect is to form the toroidal core 22. To accomplish this, a first end 27*a* of a metal conductor 26 is soldered to a first conductive track 16*a* while the second end 27*b* of the same metal conductor 26 is soldered to a second conductive track 16*b* at the opposite end where the same technique is used in subsequent metal conductors 26 and conductive tracks 16 to form the toroidal coil 13 which surrounds the toroidal core 22 to form an inductive device which functions as a current transformer 11. It should be noted that a multi-turn primary coil could be formed in a similar fashion and interweaved with the secondary. This would increase the magnetic flux into the toroidal core 22 and then into the toroidal coil 13 which comprises the secondary coil.

FIG. 5 is a plan view of the plurality of conductive tracks 16 as laid down on the ceramic substrate 12 where an insulator 20 is used to coat the center section of each of the conductive tracks providing for electrical insulation from the toroidal core 22 which is not shown. Two output tracks 17 are provided for electrically connecting a coil 13 which is subsequently formed by the metal conductors 26 when they are attached to the conductive tracks 16 and the connector section 39 is removed. The output tracks 17 are electrically connected to a multiplicity of electrical components 54 located on the second planar surface 14*b* which collectively make up the electronics package 52. The conductive tracks 16 are formed of metallized strips laid on the ceramic substrate 12. The electrical conductor 28 passes through the opening 31 formed through the substrate 12 approximately at the center of the toroidal core 22.

FIG. 6 is a plan view of the second planar surface 14*b* of the ceramic substrate 12 clearly showing a plurality of electronic components 54 which collectively make up the electronics package 52 as shown in FIG. 2. These electrical components 54 are formed on the second planar surface 14*b* prior to the firing of the ceramic substrate 12 whereupon the final structure of both the toroidal core 22 and the electronics package 52 is achieved. The inner connections of the various electronic components 54 and the values thereof are discussed in detail with reference to FIG. 7.

The above described toroidal current transformer device 10 is readily compatible with automated assembly techniques such as automated component loading equipment and pre-programmed thick film deposition operations. Bonding techniques utilized to interconnect the metal conductors 26 with the connective tracks 16 formed on the surface of the substrate 12 may be conventional such as thermal compression or ultrasonic bonding or soldering thoroughly understood and presently utilized in the electronics industry.

Using the teaching of the present invention, it is possible to incorporate effective multiple air gaps within the permeable toroid core 22 structure using variations in metallurgy induced into the thick film magnetic material that is deposited on the substrate 12 to form the toroidal core 22. The multiple gaps introduced through metallurgy permit high or primary current levels without saturating the toroidal core 22 and results in improved operational characteristics. The permeable material is deposited on the ceramic substrate 12 and can be in the form of a powdered ferrite paste which is ideal for deposition using thick film technology. This technique overcomes the problem with fringing when only one air gap is used in the toroidal core 22 where a multiplicity of effective air gaps can be created by varying the metal particle content in a thick film paste to get the same effect. The thick film paste can be applied to the ceramic substrate 12 using a technique known as tape casting or screening directly on the substrate 12. The method of tape casting involves taking a ferrite powder and adding binders to make a slurry which is then formed into a thin sheet, dried to make a flexible sheet which is punched to get thin annular rings 25 which are then stack deposited on the ceramic substrate. The resulting structure is then laminated and sintered to setup the final composition and characteristics of the toroidal core 22.

The lead frame 38 consists of a multiplicity of metal conductors 26 which are formed to encircle the toroidal core 22 and are soldered or otherwise connected to the conductive tracks 16 underlying the toroidal core 22. Each individual metal conductor 26 is connected to each end of adjacent conductive tracks 16 and then the connector section 39 is removed to separate the individual metal conductors 26 thereby forming a toroidal coil 13 structure. Thus, the metal conductors 26 are joined together by the lead frame 38 around the imaginary point 18 to form one lead frame 38 structure and then after soldering (usually using a process known as wave soldering) are separated by punching out the connector section 39 so that individual metal conductors 26 remain. Thus, a toroidal coil 13 is formed around the permeable toroidal core 22 forming the current transformer device 10 of the present invention. Also, the toroidal core 22 can be tapped at various points very easily by laying the necessary pattern on the ceramic substrate 12 to supply the electrical connection to the appropriate metal conductor 26 and then attaching the tap to the electronics package 52 mounted on the second planar side 14*b* of the substrate 12. The lead frame 38 approach is easier and cheaper than wire bonding and also permits for higher currents to be handled without failure. Also, the conductive tracks 16 can be effectively increased in cross-sectional area by coating them with a solder layer or by screening a plurality of layers to form the conductive tracks 16 to thicken the conductive tracks 16 thereby further increasing current carrying capability and lowering the value of resistance to match that of the metal conductors 26. This becomes especially important if a multi-turn primary coil is used.

The current transformer device 10 of the present invention provides for AC electric current transduction over a wide range of currents at high frequencies and at a lower factory cost than existing technologies. A ring shaped magnetic toroidal core 22 which is made up of a plurality of flat annular layers 25 of ferrite powder based thick film paste which can be mixed into a thick film ink and printed onto the substrate 12 using a screening process layer by layer or mixed into a formulation for tape casting of the layers. A toroidal core 22 is made up of a plurality of flat conductor tracks 16 printed by metallization on the substrate 12 under the toroidal core 22 and covered with a ring like dielectric layer 15. Most of the assembly steps can be accomplished using various automated processes. The conductive tracks 16 may be fabricated as part of another electrical assembly operation such as a surface mount board containing various electrical components on the opposite side of the board.

The conductive tracks 16 may also be used to provide distributed capacitance from turn to turn so as to provide wave shaping or frequency compensation. The outputs from this toroidal core 22 and toroidal coil 13 then can be put across a burden resistor, and into a matched amplifier section. Various electronic amplification and signal shaping circuits are possible which can be mounted on the second planar side **14*b* of the ceramic substrate 12 as an electronics package 52**.

It should be noted that, according to the present invention, the reduction of the resistance of the traditional wire conductors to form the toroidal coil 13 is accomplished without utilizing a gold layer or other wiring which is extremely expensive. Instead, an inexpensive lead frame holding a plurality of metal conductors 26 provides the reduction in the resistance thereby lowering the overall cost of the inductor device. The lead frame 38 consists of a plurality of flat metal conductors which are connected together with the connector section 39 to form a single structure which can be easily handled during the manufacturing process.

Now referring to FIG. 7, a schematic of the electronics package 52 shows the electronic components 54 and their interconnection for use with the current transformer device 10 to measure the electrical current flowing in conductor 28 which passes through the center opening 31 of the toroidal core 22. The following Table I lists the element label and the corresponding description of each of the electrical components 54 used in the schematic shown in FIG. 7 as the preferred embodiment of the electronics package 52 for generating an output signal indicative of the alternating electrical current flowing in the conductor 28.

TABLE I

| ELEMENT | TYPE | VALUE |
|---|---|---|
| R1 | Resistor | 3 Ω 1% |
| R2 | Resistor | 3 Ω 1% |
| R3 | Resistor | Trim |
| R4 | Resistor | 1K 1% |
| R5 | Resistor | 1K 1% |
| R6 | Resistor | 1K 1% |
| R7 | Resistor | 1K 1% |
| R8 | Resistor | 100K 1% |
| R9 | Resistor | 100K 1% |
| R10 | Resistor | 100K 1% |
| R11 | Resistor | 100K 1% |
| R12 | Resistor | 51 Ω |
| R13 | Resistor | Trim |
| R14 | Resistor | 680 Ω ½ Watt |
| R15 | Resistor | Trim |
| D1 | Diode | MBR030 |
| D2 | Diode | MBR030 |
| D3 | Diode | IN4745 |
| D4 | Diode | IN4742A |
| D5 | Diode | IN4753A |
| D6 | Diode | IN4003 |
| C1 | Capacitor | 0.1 MFD |
| C2 | Capacitor | 47 MFD |
| IC1 | Dual Oper. AMP I.C. (OA1 and OA2 contained within one package) | TLC27M4 |

Now to generally describe the operation of the electronics package 52 of the present invention, the output of the forty turn toroidal core 13 connected to the electronic package 52 through output tracks 17 (as shown in the preferred embodiment) is applied to a burden resistance comprised of resistors R1 and R2 totaling 6 ohms. Gain trim, for the entire current transformer assembly 10 is accomplished by adjustment of the effective burden resistance with a selected parallel resistance R3. The low level voltage at the effective burden resistance set by resistors R1, R2 and R3, is then coupled to the inputs 2, 3, 5 and 6 respectfully of the two identical operational amplifiers OA1 and OA2 residing in one package as amplifier package IC1, both of which are uniquely configured to provide both amplification and rectification (or absolute value conversion) in one process. Operating with a single ended power supply, each stage will only provide output in a positive direction with respect to ground, or in effect, only when an input signal from the sensor core is phased to produce a positive going amplified output. The outputs at lines 1 and 7 are then combined and decoupled through diodes D1 and D2. The diode offset voltages are compensated by keeping them inside the operational amplifier OA1 and OA2 feedback loops.

At a low sense current level, any observed lack of output signal symmetry at signal line J3 is compensated for through selection of trim resistors R13 or R15 so as to supply a small current into the toroidal current transformer 11 burden resistor network to generate a low level DC offset voltage which counters the operational amplifiers OA1 and OA2 offset differences. Use of either R13 or R15 determines the polarity of the compensation. The grounded centertap 60 between the two burden resistors R1 and R2 provides the return path for the compensating current.

Diode D6 and capacitor C2 function to rectify and filter the 18 VAC control supply voltage at supply line J1. This is then regulated to a 12VDC level by resistor R14 and Zener diode D4. In this manner the circuitry is protected from external voltage transients.

On the power supply input found at supply line J1, the Zener diode D5 clamps incoming positive polarity transients, while rectifier diode D6 blocks reverse transients. The output stages from the operational amplifiers OA1 and OA2 labeled as lines 1 and 7 are protected from transient signals which may be fed back from the output signal line J3 by the limiting action of R12 and Zener diode D3.

The toroidal current transformer assembly 10 of the present invention can be operated in a manner that permits a wider range of current level sensing as compared to the preferred embodiment and prior art methods. Transformers typically saturate at high current levels resulting in sensing errors and measurement inaccuracy since the output waveform was used in the current level output signal generation. In the method used with the present invention, a filtered peak detection output signal is generated which does not use the waveform of the toroidal coil 13.

Referring to FIG. 7, as an alternative to extend the measurement range past the toroidal core 22 saturation point, a filter capacitor can be added to the output signal J3. This modification allows the electronics package 52 to act as a filtered peak detection circuit wherein the shape of the waveform generated by the toroidal coil 13 is of no consequence in determining the current level. The current flowing in the conductor 28 must be a sinusoidal AC electrical current for this technique to work properly. The current transformer 11 is primarily sensitive to the rate of change in the current level and since the rate of change of the sinusoidal AC electrical current flowing in the conductor 28 is at a maximum value at the zero crossing point, the saturation of the toroidal core 22 by a high level of current does not greatly affect the accuracy of the measurement output signal J3. Thus, the useful range of the current transformer assembly 10 of the present invention is quite broad as compared to prior art devices.

It will be appreciated that the above-described embodiments have been set forth solely by way of example and illustration of the principles of the present invention and that various modifications and alterations may be made therein without thereby departing from the spirit and scope of the invention.

We claim:

1. A current transformer including a conductor, the average level of AC electrical current passing through said conductor to be measured comprising:

a substrate of insulating material having a first planar surface and a second planar surface;

a plurality of metallized conductive tracks formed on said first planar surface, each of said conductive tracks having a predetermined length with first and second ends;

a toroidal core formed over said conductive tracks on said planar surface comprising a plurality of ring shaped layers of magnetic material surrounding the conductor and stacked one upon the other and fired to form said toroidal core;

insulating means electrically insulating said toroidal core from said conductive tracks;

a lead frame partially covering said toroidal core comprising a multiplicity of metal conductors of predetermined length having first and second ends and looping over said toroidal core, the first end of each of said metal conductors being connected to the first end of a different one of said conductive tracks, the second end of said metal conductors being connected to the second end of a different one of said conductive tracks, said lead frame having an inner ring connector that is removed to form a toroidal coil.

2. The current transformer of claim 1, further comprising:

a plurality of electronic components mounted on said second planar surface, said electronic components connected to said coil.

3. The current transformer of claim 2, further comprising:

said conductor whose current level is to be measured encircled by said toroidal core and said coil where said electronic components generate an output signal indicative of the level of electrical AC current passing through said conductor.

4. The current transformer of claim 1, wherein said ring shaped layers are formed by punching a relatively thick tape casted ferrite sheet into thin ring shaped layers.

5. The current transformer of claim 1, wherein said first planar surface is opposite and substantially parallel to said second planar surface.

6. The current transformer of claim 1, wherein said conductive tracks are formed on said first side of said planar surface by metallization.

7. The current transformer of claim 6, wherein said conductive tracks are partially covered with an insulator layer.

8. A current transformer including a conductor, the electrical current passing through said conductor to be measured comprising:

an insulating substrate having a first planar surface and an opposite second planar surface;

a plurality of metallized coating conductive tracks formed on said first planar surface, each of said conductive tracks having a predetermined length with first and second ends;

an annular magnetic core surrounding the conductor formed using thick film processing over said conductive tracks on said first planar surface comprised of a plurality of layers of ferrite material fired to form said magnetic core;

insulating means electrically insulating said magnetic core from said conductive tracks;

a plurality of metal conductors of predetermined length each having first and second ends and looping over said magnetic core and joined to said conductive tracks to form a toroidal coil around said magnetic core where the first end of each of said metal conductor being connected to the first end of a conductive track, the second end of said metal conductor being connected to the second end of an adjacent conductive track.

9. The current transformer of claim 8, wherein said ferrite material is formulated for tape casting and where said plurality of layers are tape casted, punched, and heat laminated to form said magnetic core.

10. The current transformer of claim 8, wherein said ferrite material is formulated as a thick film ink and where said plurality of layers are printed onto said substrate one layer overlying another to form said magnetic core.

11. The current transformer of claim 10, wherein said plurality of layers are varied in magnetic properties to exhibit a predetermined inductive characteristic.

12. The current transformer of claim 8, wherein a plurality of electronic components are mounted on said second side of said substrate, said toroidal coil being connected to said electronic components.

13. The current transformer of claim 8, wherein said metal conductors are soldered to said conductive tracks.

14. An inductive device formed on a nonconductive substrate comprising:

a conductor having an electric current passing therethrough;

a nonconductive substrate having a first planar surface and a second planar surface;

a plurality of conductive tracks formed on said first planar surface by metallization, each of said conductive tracks having a predetermined length with first and second ends;

layer of dielectric material on top of and in contact with the major portion of each of said conductive tracks, both the first and second ends extending beyond said dielectric layer;

a toroidal magnetic core unit formed over said conductive tracks and said dielectric layer comprising a plurality of ring shaped layers of ferrite thick film material printed one upon another using a thick film screening process and surrounding said conductor;

a core insulating means electrically insulating said toroidal magnetic core unit;

a plurality of metal conductors of predetermined length each having first and second ends and placed over said toroidal magnetic core unit to form a toroidal coil, the first end of said metal conductors being connected to said first end of a different one of said conductive tracks, the second end of each of said metal conductors being connected to the second end of a different one of said conductive tracks;

an electronics package consisting of a plurality of electronic components mounted on said second planar surface for generating an output signal;

connection means for electrically connecting said toroidal coil to said electronics package.

15. The inductive device of claim 14, wherein said nonconductive substrate is made of a ceramic material.

16. The inductive device of claim 15, wherein said ceramic material is an alumina.

17. The inductive device of claim 16, wherein said inductive device is assembled and then fired using a standard thick film technique.

18. The inductive device of claim 14, wherein a lead frame is comprised of said plurality of metal conductors and an inner connecting section where said inner connecting section is cut from said metal conductors after connecting said metal conductors to said conductive tracks.

19. The inductive device of claim 14, wherein said ring shaped layers where each layer has a distinct predetermined magnetic characteristic for altering the saturation level of said toroidal magnetic core.

* * * * *